United States Patent [19]

Gay

[11] Patent Number: 4,667,163
[45] Date of Patent: May 19, 1987

[54] AUTOMATIC GAIN CONTROL CIRCUIT

[75] Inventor: Michael J. Gay, Coppet, Switzerland

[73] Assignee: Motorola, Inc., Schaumburg, Ill.

[21] Appl. No.: 834,265

[22] PCT Filed: Jun. 6, 1985

[86] PCT No.: PCT/GB85/00243
§ 371 Date: Feb. 6, 1986
§ 102(e) Date: Feb. 6, 1986

[87] PCT Pub. No.: WO85/05743
PCT Pub. Date: Dec. 19, 1985

[30] Foreign Application Priority Data

Jun. 6, 1984 [GB] United Kingdom ............. 8414452

[51] Int. Cl.⁴ .............................................. H03G 3/20
[52] U.S. Cl. .................................. 330/129; 330/279; 358/174
[58] Field of Search ............... 330/129, 133, 254, 279; 358/174, 175; 455/234, 240

[56] References Cited
U.S. PATENT DOCUMENTS 4,563,653 1/1986 Perahia ......................... 330/279 X

FOREIGN PATENT DOCUMENTS 0003393 8/1979 European Pat. Off. .
0156655 9/1982 German Democratic Rep. .................................. 330/129
59-74710 4/1984 Japan .
2064253 6/1981 United Kingdom .

Primary Examiner—James B. Mullins
Attorney, Agent, or Firm—Charles R. Lewis; Eugene A. Parsons

[57] ABSTRACT

An automatic gain control circuit (e.g. for use in a SECAM television receiver) comprising: an input node (2); an output node (40); controllable gain amplifier means (6) having a signal input (4) connected to the input node, a control input (24) and an output (8); automatic gain control means (20) having an input (18) coupled to the output of the controllable gain amplifier means and an output (22) connected to the control input of the controllable gain amplifier means; and divider means (30) having a first signal input (28) coupled to the output of the controllable gain amplifier means, a divide signal input (36) coupled to the input of the automatic gain control means and an output connected to the output node of circuit, whereby the signal produced at the output of the divider means is substantially independent of the signal level produced at the output of the controllable gain amplifier means.

5 Claims, 2 Drawing Figures

AUTOMATIC GAIN CONTROL CIRCUIT

This invention relates to automatic gain control circuits and particularly, though not exclusively, to automatic gain control circuits for use in the demodulation of FM signals.

In the demodulation of FM signals in a SECAM television sytem using sampling techniques, e.g. switched capacitor filter techniques, non-linearity of the circuit results in the generation of frequency components higher than the Nyquist value which can cause beat notes in the system. For example, the frequency band in a SECAM system is 3.9–4.75 MHz and so the 3rd. harmonic (such as would be generated by a limiter as normally used in FM systems) of this frequency band is 11.7–14.25 MHz. Sampling at a frequency of approximately 17.73 MHz (i.e. four times the PAL sub carrier frequency, as is convenient in a TV receiver) generates a frequency band of approximately 3.5 –6.0 MHz. Further non-linearity produces beating between this generated frequency band and the first-mentioned SECAM frequency band.

In order for the system to remain linear, an automatic gain control circuit must be used to remove amplitude variations in the FM signal. However, known automatic gain control circuits cannot readily be made to operate sufficiently fast to cope with amplitude variations resulting from the passage of such FM signals through tuned circuits, etc.

It is an object of the present invention to provide an automatic gain control circuit wherein the above disadvantage may be overcome, or at least alleviated.

In accordance with the invention an automatic gain control circuit comprises:
an input node;
an output node; controllable gain amplifier means having a signal input connected to the input node, a control input and an output; and
automatic gain control means having an input coupled to the output of the controllable gain amplifier means and an output connected to the control input of the controllable gain amplifier means, characterised in that the automatic gain control circuit further comprises divider means having a first signal input coupled to the output of the controllable gain amplifier means, a divide signal input coupled to the input of the automatic gain control means and an output connected to the output node of the circuit, whereby the signal produced at the output of the divider means is substantially independent of the signal level produced at the output of the controllable gain amplifier means.

Preferably the circuit futher comprises multiplier means having first and second inputs each connected to the output of the controllable gain amplifier means and an output connected to the input of the automatic gain control means, and the divider means has a second signal input connected to the output of the controllable gain amplifier means and includes means for multiplying the signals at its first and second signal inputs.

Preferably phase shifting filter means is provided in the signal path to the first signal input of the divider means so that the circuit is frequency discriminating and low-pass filter means is provided in the signal path to the divide signal input of the divider means, the delays produced by the two filter means being so matched as to minimise differential delay effects at the output of the divider means.

One frequency discriminating automatic gain control circuit in accordance with the invention will now be described, by way of example only, with reference to the accompanying drawings, in which.

Figure 1:
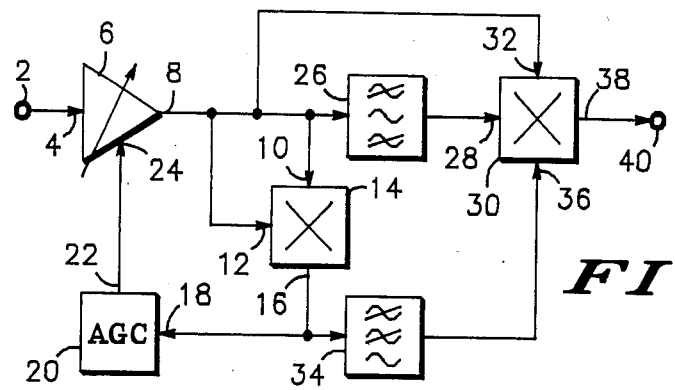
FIG. 1 shows a block-schematic diagram of the circuit.

Referring firstly to FIG. 1, a frequency discriminating automatic gain control circuit for use in an FM decoder in a SECAM TV receiver includes an input node 2 connected to the signal input 4 of a variable gain amplifier 6. The output 8 of the amplifier 6 is connected to each of two inputs 10, 12 of a multiplier 14. The output 16 of the multiplier 14 is connected to the input 18 of a known automatic gain control (AGC) gain generator 20. The output 22 of the AGC gain generator 20 is connected to the control input 24 of the amplifier 6 to control the gain thereof.

The output 8 of the amplifier 6 is also connected, via a constant amplitude, phase-shifting filter 26, to a first multiply input 28 of a multiplier/divider 30. The output 8 of the amplifier 6 is also connected directly to a second multiply input 32 of the multiplier/divider 30. The output 16 of the multiplier 14 is also connected, via a low-pass filter 34, to a divide input 36 of the multiplier/divider 30. The output 38 of the multiplier/divider 30 is connected to an output node 40 of the circuit.

In use of the circuit of FIG. 1 a SECAM FM signal $V_1$ applied to the input node 2 is amplified by amplifer 6 to produce a signal $V_2$ at its output 8. This signal is then rectified by the multiplier 14 to produce at its output 16 a signal $kV_2^2$, k being the multiplication factor of the multiplier 14. The rectified signal at the multiplier output 16 is applied to the AGC gain generator 20, which accordingly controls the gain of the amplifier 6, and is also applied via the filter 34 to the divide input 36 of the multiplier/divider 30.

The signal $V_2$ produced at the output 8 of the amplifer 6 is phase-shifted by the filter 26 in dependence on the frequency of the signal $V_2$ to produce a phase shifted signal $(V_2)_0$ which is applied to the multiply input 28 of the multiplier/divider 30. The signal $V_2$ produced at the output 8 of the amplifer 6 is also applied directly to the muliply input 32 of the multiplier/divider 30. The multiplier/divider 30 produces at its output 38 a signal $V_3$ which is the product of the signals $(V_2)_0$ and $V_2$ at its inputs 28 and 32 divided by the signal $kV_2^2$ at its input 34.

It will be understood that the frequency dependent phase shift provided by the filter 26 produces frequency discrimination in the product of the signals $(V_2)_0$ and $V_2$, as is well known, and so also in the signal $V_3$.

It will, of course, be readily appreciated that the amplitude of the signal $V_3$ is independent of the amplitude of the signal $V_2$ and so is independent of any variations in amplitude which are not compensated by the AGC loop 6, 14, 20. It will also be appreciated that because the signal $kV_2^2$ is fed forward from the multiplier 14 to the multiplier/divider 30, the compensation provided by the multiplier/divider 30 is not limited by the response time of the AGC gain generator 20 and the variable gain amplifier 6. In practice the AGC loop 6, 14, 20 may typically compensate for relatively slow amplitude variations of wide range (e.g. up to 60 dB) whereas the multiplier/divider 30 may typically compensate for relatively fast amplitude variations of narrow range (e.g. up to 6 dB).

It will also be understood that the delays produced by the filters 26 and 34 are arranged to be substantially the same so as to minimise differential delay effects in the signal $V_3$.

Figure 2:
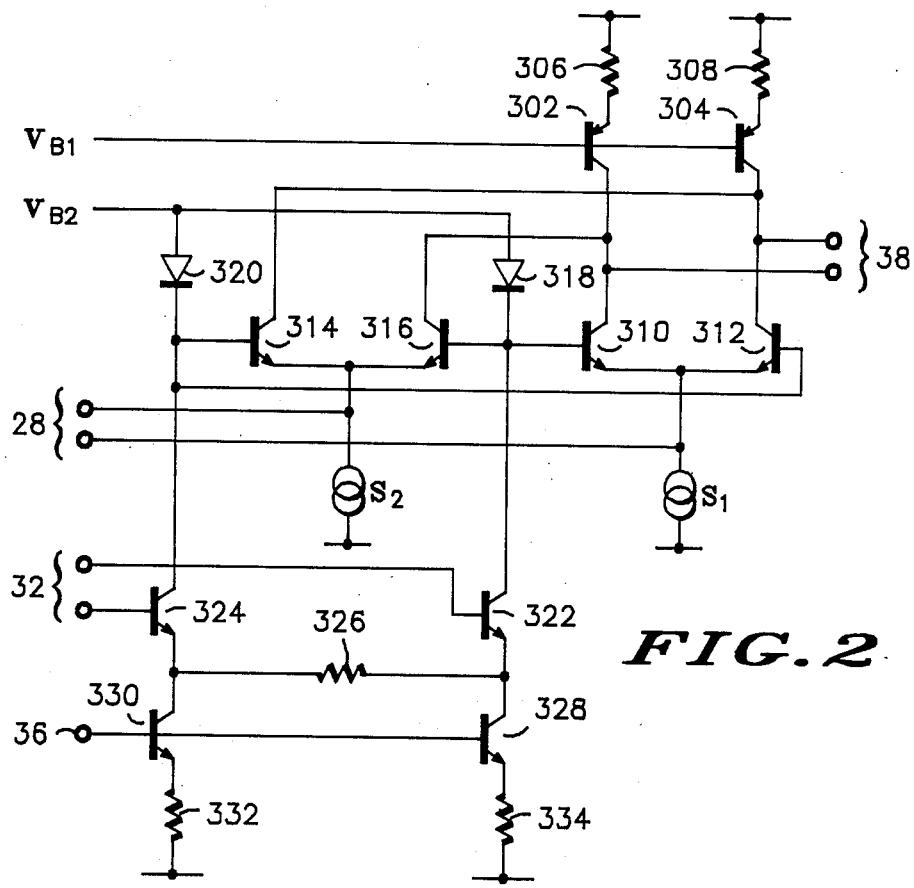
FIG. 2 shows a more detailed circuit diagram of parts of the circuit of FIG. 1.

Referring now also to FIG. 2, the multiplier/divider 30 includes a pair of pnp transistors 302, 304 each having their bases connected to a source of bias voltage $V_{B1}$ and having their emitters connected respectively via resistors 306, 308 to a source of positive supply. A first pair of npn transistors 310, 312 have their emitters commonly connected to a first current source $S_1$ and have their collectors connected respectively to the collectors of the transistors 302 and 304. A second pair of npn transistors 314, 316 have their emitters commonly connected to a second current source $S_2$ and have their collectors respectively connected to the collectors of the transistors 304 and 302. The bases of the transistors 310 and 316 are connected via a diode 318 to a source of bias voltage $V_{B2}$, and the bases of the transistors 312 and 314 are connected via a diode 320 to the voltage $V_{B2}$. A third pair of npn transistors 322, 324 have their collectors connected respectively to the bases of the transistors 310, 316 and to the bases of the transistors 312, 314. The emitters of the transistors 320 and 322 are interconnected via a resistor 326. A fourth pair of npn transistors 328, 330 have their collectors connected respectively to the emitters of the transistors 322, 324, and have their emitters connected to ground via respective resistors 332, 334.

The emitters of the transistors 310, 312 and the emitters of the transistors 314, 316 are differentially connected as the multiply input 28 of the multiplier/divider 30. The bases of the transistors 322, 324 are differentially connected as the multiply input 32 of the multiplier/divider 30. The bases of the transistors 328, 330 are commonly connected as the divide input 36 of the multiplier/divider 30. The output 38 of the multiplier/divider 30 is taken differentially between the collectors of the transistors 312, 314 and 310, 316.

It will be realised that the circuit of FIG. 2 acts in known manner as a multiplier, the differential voltage at the output 38 being proportional to the product of the differential signals at the inputs 28 and 32. It will also be understood that the circuit additionally acts as a divider, the voltage at the output 38 being reduced in proportion to the voltage applied at input 36 to the bases of the transistors 328, 330.

It will be appreciated that a similar circuit to that of FIG. 2 may be used for the multiplier 14, the voltage there applied to the bases of the transistors 328, 330 being chosen so as to produce a desired multiplication factor k.

It will be appreciated that the circuit described above may conveniently be fabricated in integrated circuit form.

What is claimed is:

1. An automatic gain control circuit comprising:
   a controllable gain amplifier having a signal input operating as a input node of the automatic gain control circuit, a control input, and an output;
   a multiplier having first and second inputs coupled at the output of said controllable gain amplifier and an output;
   an AGC gain generator having an input coupled to the output of said multiplier and an output coupled to the control input of said controllable gain amplifier; and
   a multiplier/divider circuit having first and second multiplier inputs coupled to the output of said controllable gain amplifier, a divider input coupled to the output of said multiplier, and an output operating as an output node of the automatic gain control circuit.

2. An automatic gain control circuit as claimed in claim 1 wherein one of the first and second multiplier inputs of said multiplier/divider circuit is coupled through a phase shifting filter to the output of said controllable gain amplifier.

3. An automatic gain control circuit as claimed in claim 2 wherein the divider input of said multiplier/divider circuit is coupled through a low pass filter to the output of said multiplier and signal delays produced by said low-pass filter and said phase shifting filter are substantially matched to minimize differential delay effects at the output of said multiplier/divider circuit.

4. An automatic gain control circuit as claimed in claim 1 wherein said controllable gain amplifier, said multiplier, said AGC gain generator, and said multiplier/divider circuit are included in an integrated circuit with associated circuitry.

5. An automatic gain control circuit as claimed in claim 1 wherein said controllable gain amplifier, said multiplier, said AGC gain generator, and said multiplier/divider circuit are included in a SECAM television receiver.

* * * * *